United States Patent
Chang et al.

(10) Patent No.: US 11,895,787 B2
(45) Date of Patent: Feb. 6, 2024

(54) MULTI-DIRECTIONAL MULTI-JOINT TURNING PIECE AND DISPLAY DEVICE THEREOF

(71) Applicant: STAR ASIA VISION CORPORATION, Hsinchu (TW)

(72) Inventors: Chien-Feng Chang, Hsinchu (TW);
Tsung-Huai Lee, Hsinchu (TW);
Yu-Hung Hsiao, Hsinchu (TW);
Chan-Peng Lin, Hsinchu (TW);
Shang-Chien Wu, Hsinchu (TW)

(73) Assignee: STAR ASIA VISION CORPORATION, Hsinchu (TW)

( * ) Notice: Subject to any disclaimer, the term of this patent is extended or adjusted under 35 U.S.C. 154(b) by 67 days.

(21) Appl. No.: 17/396,103

(22) Filed: Aug. 6, 2021

(65) Prior Publication Data
US 2022/0330444 A1    Oct. 13, 2022

(30) Foreign Application Priority Data

Apr. 12, 2021   (TW) .................................. 110113036

(51) Int. Cl.
*H05K 5/02*     (2006.01)
*H05K 5/00*     (2006.01)
*F16C 11/04*    (2006.01)
*E05D 3/06*     (2006.01)

(52) U.S. Cl.
CPC ............ *H05K 5/0217* (2013.01); *F16C 11/04* (2013.01); *H05K 5/0017* (2013.01); *E05D 3/06* (2013.01); *E05Y 2900/606* (2013.01)

(58) Field of Classification Search
CPC ..... H05K 5/0226; H05K 5/0217; F16C 11/04; E05D 3/06; E05Y 2900/606
See application file for complete search history.

(56) References Cited

U.S. PATENT DOCUMENTS 5,383,138 A * 1/1995 Motoyama ............ G06F 1/1683
                                                361/679.58
8,539,705 B2 * 9/2013 Bullister ............... G06F 1/1615
                                                361/679.04

(Continued)

*Primary Examiner* — Rockshana D Chowdhury
*Assistant Examiner* — Douglas R Burtner
(74) *Attorney, Agent, or Firm* — MUNCY, GEISSLER, OLDS & LOWE, PC (57) ABSTRACT

The present invention provides a multi-directional multi-joint turning piece and a display device including the multi-directional multi-joint turning piece. The multi-directional multi-joint turning piece is configured to connect a first display module and a second display module to provide a first display module unfolded or folded with the second display module. The multi-directional multi-joint turning piece includes a first coupling piece, a first turning piece, a second turning piece, a third turning piece, and a second coupling piece, wherein the first coupling piece is connected to the first display module, the second coupling piece is connected to the second display module, the first coupling piece is pivoted to the first turning piece, the first turning piece is pivoted to the second turning piece, the second turning piece is pivoted to the third turning piece, and the third turning piece is pivoted to the second coupling piece.

6 Claims, 10 Drawing Sheets

(56) References Cited

U.S. PATENT DOCUMENTS

| | | | | |
|---|---|---|---|---|
| 8,933,874 | B2* | 1/2015 | Lundqvist | H04M 1/0247 |
| | | | | 345/1.3 |
| 8,976,519 | B2* | 3/2015 | Lai | G06F 1/1607 |
| | | | | 248/922 |
| 9,104,375 | B2* | 8/2015 | Lee | G06F 1/1662 |
| 9,110,636 | B2* | 8/2015 | Shen | G06F 1/1679 |
| 9,201,466 | B2* | 12/2015 | Lai | G06F 1/1681 |
| 9,213,371 | B2* | 12/2015 | Liu | G06F 1/1664 |
| 9,375,080 | B2* | 6/2016 | Glekas | A47B 47/0091 |
| 9,750,144 | B2* | 8/2017 | Nakamura | G06F 1/1681 |
| 10,254,803 | B1* | 4/2019 | Quinn | G06F 1/1688 |
| 10,364,598 | B2* | 7/2019 | Tazbaz | E05D 11/1064 |
| 10,852,775 | B1* | 12/2020 | Kim | E05D 3/02 |
| 10,990,129 | B2* | 4/2021 | Miele | G06F 1/1649 |
| 11,039,542 | B2* | 6/2021 | Yu | H04M 1/0268 |
| 11,079,620 | B2* | 8/2021 | Inagaki | G09F 9/30 |
| 11,357,275 | B2* | 6/2022 | Pandolfino | A44C 25/002 |
| 11,573,602 | B2* | 2/2023 | Lin | G06F 1/1641 |
| 2014/0217875 | A1* | 8/2014 | Park | G06F 1/1681 |
| | | | | 16/354 |
| 2017/0356225 | A1* | 12/2017 | Määttä | E05D 1/04 |
| 2017/0356226 | A1* | 12/2017 | Määttä | H04M 1/022 |
| 2018/0077810 | A1* | 3/2018 | Moon | H05K 5/0017 |
| 2019/0029135 | A1* | 1/2019 | Park | G06F 1/1616 |
| 2020/0015370 | A1* | 1/2020 | Kim | H05K 5/0204 |
| 2020/0029449 | A1* | 1/2020 | Makinen | G06F 1/1681 |
| 2020/0170127 | A1* | 5/2020 | Kim | H05K 5/0226 |
| 2020/0170128 | A1* | 5/2020 | Kim | G06F 1/1681 |
| 2020/0253069 | A1* | 8/2020 | Cha | G06F 1/1681 |
| 2020/0301480 | A1* | 9/2020 | Miller | E05D 11/082 |
| 2020/0371563 | A1* | 11/2020 | Collins | H05K 7/16 |
| 2022/0283608 | A1* | 9/2022 | Xianyu | G06F 1/1673 |
| 2022/0346258 | A1* | 10/2022 | Liu | G06F 1/1681 |

* cited by examiner

MULTI-DIRECTIONAL MULTI-JOINT TURNING PIECE AND DISPLAY DEVICE THEREOF

FIELD OF THE INVENTION

The present invention relates to a multi-directional multi-joint turning piece and a display module, more particularly, to multi-directional multi-joint turning pieces and display modules with multi-directional multi-joint turning pieces that provide pivot/turning/unfolding/stacking between the display modules, and the display modules to be connected with each other in seamless or minimum spacing by the multi-directional multi-joint turning pieces.

BACKGROUND OF THE INVENTION

Currently, electronic devices with large screens have become a trend of development. In order to increase the display size of mobile phones, which are being developed into full-screen displays. The camera of the mobile phone is designed to be raised and lowered relative to the housing of the mobile phone, or the housing is designed to be slidable so that the screen can be extended.

In terms of indoor or outdoor large-size display devices, according to the global research report on large-size LCD panels, shipments of large-size LCD displays such as computers, monitors, and TVs have hit a new high in recent years. Nowadays, public displays and outdoor displays are gradually becoming popular. Applications such as LED large-screen display devices with irregular shapes can be customized according to the building's exterior walls and installed on the exterior walls to be integrated with the entire building. By displaying creative content, the display screen turns the entire building into a unique landmark combining art and technology. Due to its high degree of customization in terms of shape and size, it is necessary to design display devices of different sizes according to requirements. By connected display modules with each other in seamless, a large size display device can be completed.

The above-mentioned large-size display device is usually made by the combination of a plurality of small-unit display modules. When assembling the plurality of small-unit display modules, connection devices are used to connect them. In the traditional way, display modules are stacked on top of each other for storage. When the display modules are to be assembled, the display modules are connected to each other by connecting devices. Assembly and storage require a lot of manpower and time.

Therefore, it is necessary to overcome the above-mentioned problems and provide a connecting device and display module that can provide a stable pivot between display modules and facilitate storage/deployment, so as to meet the large-scale demand for large-size display devices today.

SUMMARY OF THE INVENTION

The present invention provides a multi-directional multi-joint turning piece, configured to connect a first display module and a second display module and to provide the first display module and the second display module to unfold or fold each other, comprising a first coupling piece, a first turning piece, a second turning piece, a third turning piece, and a second coupling piece, wherein the first coupling piece is connected to the first display module and the second coupling piece is connected to the first display module, the first coupling piece is pivoted to the first turning piece, the first turning piece is pivoted to the second turning piece, the second turning piece is pivoted to the third turning piece, and the third turning piece is pivoted to the second coupling piece.

According to one aspect of the present invention, the first coupling piece and the first turning piece are pivoted forward or backward to each the first turning piece and the second turning piece are pivoted forward or backward to each other, the second turning piece and the third turning piece are pivoted forward or backward to each other, the third turning piece and the second coupling piece are pivoted forward or backward to each other, when the first display module and the second display module are unfolded or folded.

According to one aspect of the present invention, it further includes a first plug-in piece, the first coupling piece includes a first connecting portion, the first connecting portion is a rectangular structure with a front and a rear symmetrical panels having a first spacing between the front and the rear panels, the first connecting portion is disposed at one end of the first coupling piece, the first turning piece is a rectangular structure including a second connecting portion and a third connecting portion, the second connecting portion is a rectangular structure with a first thickness, the second connecting portion disposed at one end of the first turning piece, the third connecting portion is a rectangular structure with two the front and the rear symmetrical panels having a second spacing between the front and the rear panels, the third connecting portion is disposed at the other end of the first turning piece, and the first turning piece has a second thickness, the first thickness is smaller than the second thickness, the first thickness is smaller than the first spacing, the first coupling piece is connected with the first turning piece by the insertion of the second connecting portion into the first connecting portion, the first plug-in piece is inserted into the first through-hole, the first coupling piece is pivoted to the first turning piece, and the first plug-in piece is used as a pivot.

According to one aspect of the present invention, it further includes a second plug-in piece, the second turning piece is a lamellar rectangular structure with a third thickness, the second turning piece includes a fourth connecting portion and a fifth connecting portion, the first turning piece is connected to the second turning piece by the insertion of the fourth connecting portion into the third connecting portion, the second plug-in piece is inserted into the second through-hole, and the first turning piece is pivoted to the second turning piece, and the second plug-in piece is used as a pivot.

According to one aspect of the present invention, it further includes a third plug-in piece, the third turning piece comprising third plug-in piece, it further includes the third turning piece includes a sixth connecting portion and a seventh connecting portion, the third turning piece is a rectangular structure with a fourth thickness, the sixth connecting portion is a rectangular structure with a front and a rear symmetrical panels having a third spacing between the front and the rear panels, the sixth connecting portion is disposed at one end of the third turning piece, and the seventh connecting portion is disposed at the other end of the third turning piece, the third thickness is smaller than the second spacing and the third spacing, the third turning piece is connected to the second turning piece by the insertion of the fifth connecting portion into the sixth connecting portion, the third plug-in piece is inserted into the third through-hole, the third plug-in piece is pivoted to the second turning piece, and the third plug-in piece is used as a pivot.

According to one aspect of the present invention, it further includes a fourth plug-in piece, the second coupling piece includes an eighth connecting portion, the eighth connecting portion is a rectangular structure with a front and a rear symmetrical panels having a fourth spacing between the front and the rear panels, the eighth connecting portion is disposed at one end of the second coupling piece, the third turning piece includes a seventh connecting portion, the seventh connecting portion is a rectangular structure with a fifth thickness, the seventh connecting portion is disposed at the other end of the third turning piece, the third turning piece is a rectangular structure with a fourth thickness, the fifth thickness is smaller than the fourth thickness, and the fifth thickness is smaller than the fourth spacing, the second coupling piece is connected with the third turning piece by inserting the seventh connecting portion into the eighth connecting portion, the fourth plug-in piece is inserted into the fourth through-hole, and the second coupling piece is pivoted to the third turning piece and the fourth plug-in piece is used as a pivot.

According to an aspect of the present invention, wherein, the first turning piece and the first coupling piece have a first included angle, the first included angle ranges from 102.42 degrees to 180 degrees, the third turning piece and the second coupling piece have a second included angle, and the second included angle ranges from 102.42 degrees to 180 degrees.

According to another aspect of the present invention, a display device is provided, comprising at least two display modules and at least two multi-directional multi-joint turning pieces, the display modules include a first display module and a second display module, the multi-directional multi-joint turning pieces include a first multi-directional multi-joint turning piece and a second multi-directional multi-joint turning piece, the first multi-directional multi-joint turning piece and the second multi-directional multi-joint turning piece are symmetrically arranged at both ends of a corresponding side of the first display module and the second display module to provide the first display module and the second display module are symmetrically unfolded or folded with the side as the center, the second display module includes a guiding device arranged on the back of the second display module and adjacent to the side, the guiding device is configured to guide the first display module, wherein the multi-directional multi-joint turning piece includes a first coupling piece, a first turning piece, a second turning piece, and a third turning piece, the second coupling piece and the guiding device, the first connecting piece is pivoted to the first turning piece, the first turning piece is pivoted to the second turning piece, the second turning piece is pivoted to the third turning piece, the third turning piece is pivoted to the second coupling piece, when the first display module and the second display module are switched between folding and unfolding, the first turning piece pivots relative to the first coupling piece and the second turning piece, and the third turning piece pivots relative to the second coupling piece and the second turning piece, when the display module is switched from folded to unfolded, the other side of the first display module relative to the side is pulled, the side of the first display module is guided by one end of the guiding device and slides to the other end, the first display module and the second display module are symmetrically unfolded with the side edge as the center, and the first display module and the second display module form a seamless display device.

According to an aspect of the present invention, wherein the first coupling piece and the first turning piece pivot forward or backward to each other, and the first turning piece and the second turning piece pivot forward or backward to each other, the second turning piece and the third turning piece pivot forward or backward to each other, and the third turning piece and the second coupling piece pivot forward or backward to each other, when the first display module and the second display module are unfolded or folded.

According to an aspect of the present invention, wherein, one end of the first coupling piece is provided with a first through-hole for connecting one end of the first turning piece, the other end of the first turning piece is provided with a second through-hole for connecting one end of the second turning piece, the other end of the second turning piece is provided with a third through-hole for connecting one end of the third turning piece, the other end of the third turning piece is provided with a fourth through-hole for connecting one end of the second coupling piece.

According to an aspect of the present invention, further comprising a first plug-in piece, the first coupling piece includes a first connecting portion, the first connecting portion is a rectangular structure with a front and a rear symmetrical panels having a first spacing between the front and the rear panels, the first connecting portion is disposed at one end of the first coupling piece, the first turning piece is a rectangular structure including a second connecting portion and a third connecting portion, the second connecting portion is a rectangular structure with a first thickness, the second connecting portion disposed at one end of the first turning piece, the third connecting portion is a rectangular structure with the front and the rear symmetrical panels having a second spacing between the front and the rear panels, the third connecting portion is disposed at the other end of the first turning piece, and the first turning piece has a second thickness, the first thickness is smaller than the second thickness, the first thickness is smaller than the first spacing, the first coupling piece is connected with the first turning piece by the insertion of the second connecting portion into the first connecting portion, the first plug-in piece is inserted into the first through-hole, the first coupling piece is pivoted to the first turning piece, and the first plug-in piece is used as a pivot.

According to an aspect of the present invention, further comprising a second plug-in piece, wherein the second turning piece is a lamellar rectangular structure with a third thickness, the second turning piece includes a fourth connecting portion and a fifth connecting portion, the first turning piece is connected to the second turning piece by the insertion of the fourth connecting portion into the third connecting portion, the second plug-in piece is inserted into the second through-hole, and the first turning piece is pivoted to the second turning piece, and the second plug-in piece is used as a pivot.

According to an aspect of the present invention, further comprising a third plug-in piece, wherein the third turning piece includes a sixth connecting portion and a seventh connecting portion, the third turning piece is a rectangular structure with a fourth thickness, the sixth connecting portion is a rectangular structure with a front and a rear symmetrical panels having a third spacing between the front and the rear panels, the sixth connecting portion is disposed at one end of the third turning piece, and the seventh connecting portion is disposed at the other end of the third turning piece, the third thickness is smaller than the second spacing and the third spacing, the third turning piece is connected to the second turning piece by the insertion of the fifth connecting portion into the sixth connecting portion, the third plug-in piece is inserted into the third through-hole, the third plug-in piece is pivoted to the second turning piece, and the third plug-in piece is used as a pivot.

According to an aspect of the present invention, further comprising fourth plug-in piece, wherein the second coupling piece includes an eighth connecting portion, the eighth connecting portion is a rectangular structure with a front and a rear symmetrical panels having a fourth spacing between the front and the rear panels, the eighth connecting portion is disposed at one end of the second coupling piece, the third turning piece includes a seventh connecting portion, the seventh connecting portion is a rectangular structure with a fifth thickness, the seventh connecting portion is disposed at the other end of the third turning piece, the third turning piece is a rectangular structure with a fourth thickness, the fifth thickness is smaller than the fourth thickness, and the fifth thickness is smaller than the fourth spacing, the second coupling piece is connected with the third turning piece by inserting the seventh connecting portion into the eighth connecting portion, the fourth plug-in piece is inserted into the fourth through-hole, and the second coupling piece is pivoted to the third turning piece and the fourth plug-in piece is used as a pivot.

According to an aspect of the present invention, wherein the first turning piece and the first coupling piece have a first included angle, the first included angle ranges from 102.42 degrees to 180 degrees, the third turning piece and the second coupling piece have a second included angle, and the second included angle ranges from 102.42 degrees to 180 degrees.

According to an aspect of the present invention, wherein the third thickness is 1 cm.

The present invention is defined by the scope of the following patentable scope, and this paragraph should not be regarded as a limitation on the scope of those patentable scopes. Further modalities and advantages of the present invention are discussed below in conjunction with the preferred embodiments and may subsequently be requested independently or in combination.

DETAILED DESCRIPTION OF THE PREFERRED EMBODIMENTS

In order to make the description of the present disclosure more detailed and complete, please refer to the attached drawings and the various embodiments described below. The elements in the drawings are not drawn to scale and are provided only to illustrate the present disclosure. The following practical details are described in order to provide a comprehensive understanding of this disclosure. However, those of ordinary skill in the relevant fields should understand that this disclosure can be implemented without one or more practical details. Therefore, these details should not be used to limit this disclosure.

In addition, in the description shown below, the same constituent elements are denoted by the same reference numerals and are illustrated. The names and functions of these constituent elements are also the same. Therefore, detailed descriptions of these elements are sometimes omitted to avoid duplication.

Figure 1A:
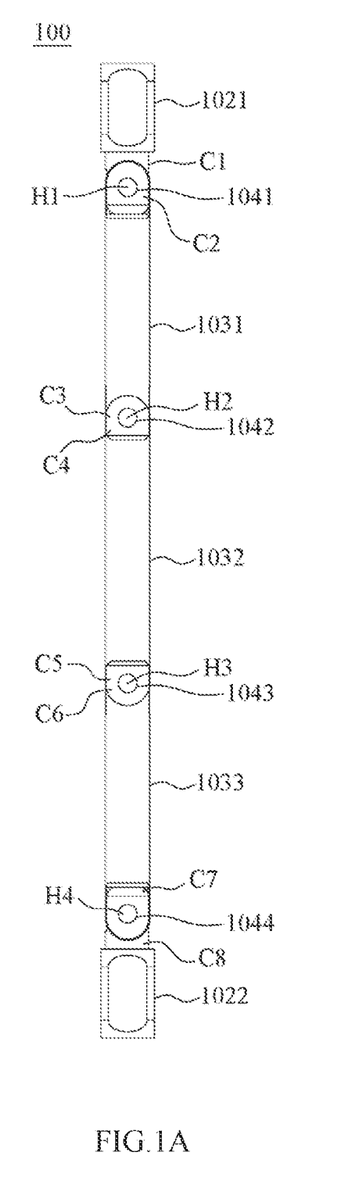
FIG. 1A is a side view of the multi-directional multi-joint turning piece of the present invention.
Figure 1B:
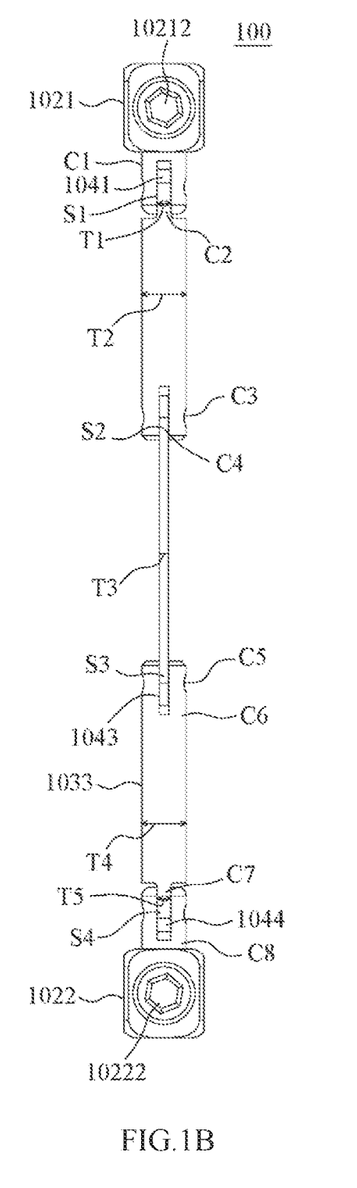
FIG. 1B is a top view of the multi-directional multi-joint turning piece of the present invention.
Figure 2:
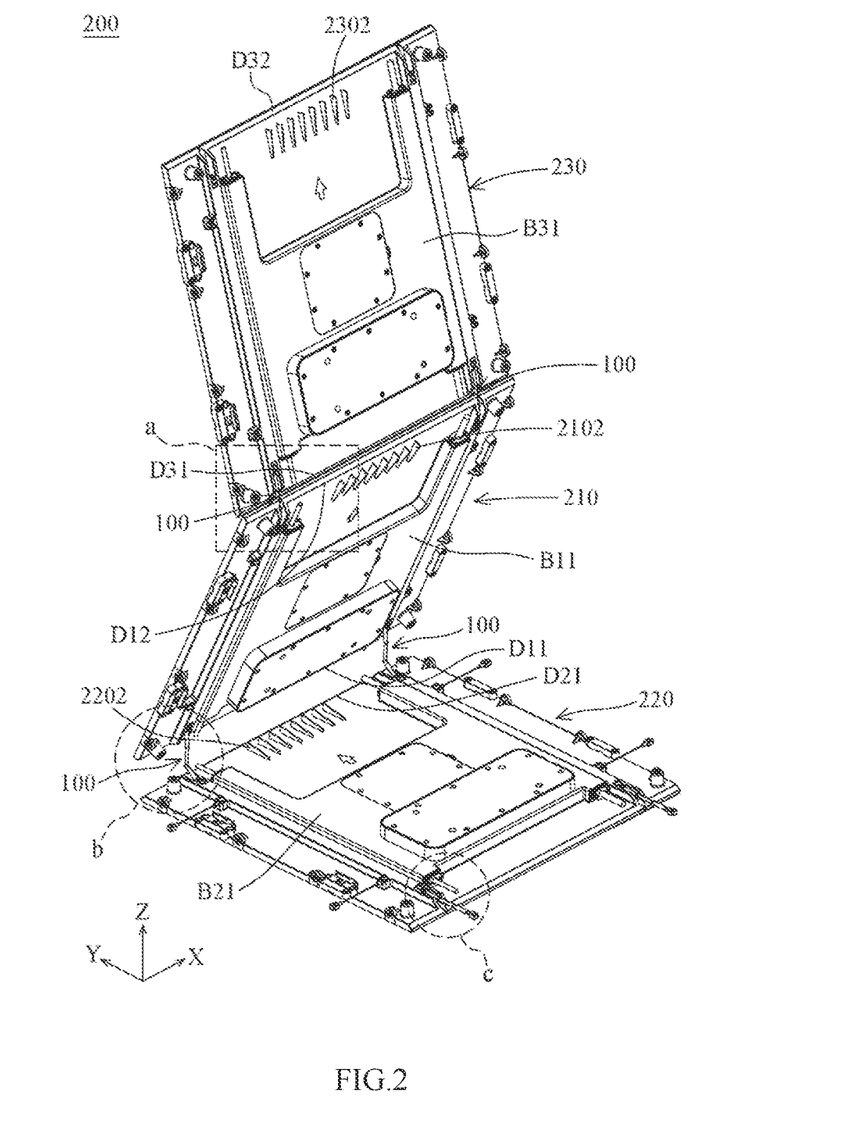
FIG. 2 is a schematic diagram of a display module with multi-directional multi-joint turning piece according to the present invention.
Figure 5:
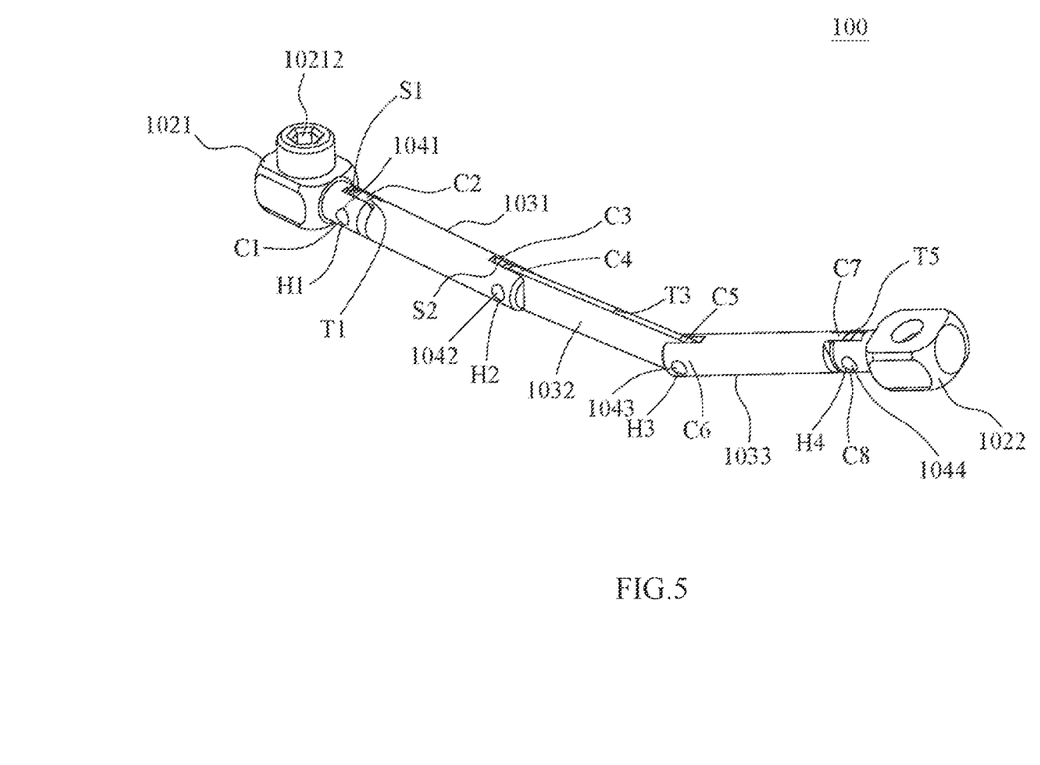
FIG. 5 is a three-dimensional schematic diagram of the multi-directional multi-joint turning piece of the present invention.

Please refer to FIG. 1A, FIG. 1B, FIG. 2, and FIG. 5, wherein FIG. 1A is a side view of the multi-directional multi-joint turning piece of the present invention. FIG. 1B is a top view of the multi-directional multi-joint turning piece of the present invention. FIG. 2 is a schematic diagram of a display module with a multi-directional multi-joint turning piece according to the present invention. FIG. 5 is a three-dimensional schematic diagram of the multi-directional multi-joint turning piece of the present invention. A plurality of multi-directional multi-joint turning pieces 100 are provided, which are connected between the first display module 210 and the second display module 220, and between the third display module 230 and the first display module 210, respectively. The multi-directional multi-joint turning piece 100 provides the first display module 210 and the second display module 220 to unfold and fold each other. The multi-directional multi-joint turning piece 100 provides the third display module 230 and the first display module 210 to unfold and fold each other. The multi-directional multi-joint turning piece 100 includes a first coupling piece 1021, a second coupling piece 1022, and a first turning piece 1031, a second turning piece 1032, and a third turning piece 1033. The first coupling piece 1021 is connected to the first display module 210, and the second coupling piece 1022 is connected to the second display module 220. The first coupling piece 1021 is pivoted to the first turning piece 1031. The first turning piece 1031 is pivoted to the second turning piece 1032. The second turning piece 1032 is pivoted to the third turning piece 1033. The third turning piece 1033 is pivoted to the second coupling piece 1022.

The first coupling piece 1021 and the first turning piece 1031 are pivoted forward or backward to each other. The first turning piece 1031 and the second turning piece 1032 are pivoted forward or backward to each other. The second turning piece 1032 and the third turning piece 1033 are pivoted forward or backward to each other. The third turning piece 1033 and the second coupling piece 1022 are pivoted forward or backward to each other, when the first display module 210 and the second display module 220 are unfolded or folded.

One end of the first coupling piece 1021 is provided with a first through-hole H1 for connecting one end of the first turning piece 1031. The other end of the first turning piece 1031 is provided with a second through-hole H2 for connecting one end of the second turning piece 1032. The other end of the second turning piece 1032 is provided with a third through-hole H3 for connecting one end of the third turning piece 1033. The other end of the third turning piece 1033 is provided with a fourth through-hole H4 for connecting one end of the second coupling piece 1022.

Please refer to FIG. 1A, FIG. 1B and FIG. 5, the multi-directional multi-joint turning piece 100 includes a first plug-in piece 1041, a second plug-in piece 1042, a third plug-in piece 1043, and a fourth plug-in piece 1044. The first coupling piece 1021 includes a first connecting portion C1. The first connecting portion C1 is a rectangular structure with a front and a rear symmetrical panels having a first spacing S1 between the front and rear panels. The first connecting portion C1 is disposed at one end of the first coupling piece 1021. The first turning piece 1031 is a rectangular structure including a second connecting portion C2 and a third connecting portion C3. The second connecting portion C2 is a rectangular structure with a first thickness T1. The second connecting portion C2 is provided at one end of the first turning piece 1031. The third connecting portion C3 is a rectangular structure with the front and the rear symmetrical panels having a second spacing S2 between the front and the rear panels. The third connecting portion C3 is disposed at the other end of the first turning piece 1031. The first turning piece 1031 has a second thickness T2, and the first thickness T1 is smaller than the second thickness T2. The first thickness T1 is smaller than the first spacing S1, the first coupling piece 1021 is connected with the first turning piece 1031 by the insertion of the second connecting portion C2 into the first connecting portion C1, and the first plug-in piece 1041 is inserted into the first through-hole H1. The first coupling piece 1021 is pivoted to the first turning piece 1031 by using the first plug-in piece 1041 as a pivot.

The second turning piece 1032 is a lamellar rectangular structure with a third thickness T3. In this embodiment, the third thickness T3 is preferably 1 cm. It should be noted that the third thickness T3 can also be any thickness. The second turning piece 1032 includes a fourth connecting portion C4 and a fifth connecting portion C5. The first turning piece 1031 is connected to the second turning piece 1032 by the insertion of the fourth connecting portion C4 into the third connecting portion C3. The second plug-in piece 1042 is inserted into the second through-hole H2, and the first turning piece 1031 is pivoted to the second turning piece 1032, and the second plug-in piece 1042 is used as a pivot.

The third turning piece 1033 includes a sixth connecting portion C6 and a seventh connecting portion C7. The third turning piece 1033 is a rectangular structure with a fourth thickness T4. The sixth connecting portion C6 is a rectangular structure with the front and the rear symmetrical panels having a third spacing S3 between the front and the rear panels, the sixth connecting portion C6 is disposed at one end of the third turning piece 1033. The seventh connecting portion C7 is disposed at the other end of the third turning piece 1033. The third thickness T3 is smaller than the second pitch S2 and the third pitch S3. The third turning piece 1033 is connected to the second turning piece 1032 by the insertion of the fifth connecting portion C5 into the sixth connecting portion C6. The third plug-in piece 1043 is inserted into the third through-hole H3, and the third turning piece 1033 is pivoted to the second turning piece 1032, and the third plug-in piece 1043 is used as a pivot.

The second coupling piece 1022 includes an eighth connecting portion C8. The eighth connecting portion C8 has symmetrical front and rear panels and has a rectangular structure with a fourth spacing S4 between the front and back panels. The eighth connecting portion C8 is set at one end of the second coupling piece 1022. The third turning piece 1033 includes a seventh connecting portion C7. The seventh connecting portion C7 is a rectangular structure with a fifth thickness T5. The seventh connecting portion C7 is disposed at the other end of the third turning piece 1033. The third turning piece 1033 is a rectangular structure with a fourth thickness T4. The fifth thickness T5 is smaller than the fourth thickness T4, and the fifth thickness T5 is smaller than the fourth spacing S4. The second coupling piece 1022 is connected with the third turning piece 1033 by the insertion of the seventh connecting portion C7 into the eighth connecting portion C8. The fourth plug-in piece 1044 is inserted into the fourth through-hole H4, and the second coupling piece 1022 is pivoted to the third turning piece 1033 with the fourth plug-in piece 1044 as a pivot axis.

In the multi-directional multi-joint turning piece 100 of the present invention, the first turning piece 1031 and the first coupling piece 1021 have a first included angle, and the first included angle ranges from 102.42 degrees to 180 degrees. There is a second included angle between the third turning piece 1033 and the second coupling piece 102, and the second included angle ranges from 102.42 degrees to 180 degrees. With the design of the multi-directional multi-joint turning piece 100 of the present invention, the first display module 210, the second display module 220, and the third display module 230 can be provided with the effect of angle suppression during the pivot process, so as to avoid the storage and stacking of items.

Referring to FIG. 2, in another embodiment of the present invention, a display device 200 is provided, which includes a first display module 210 and a second display module 220. In this embodiment, the first display module 210, the second display module 220, and the third display module 230, and four multi-directional multi-joint turning pieces 100 are illustrated, wherein the two multi-directional multi-joint turning pieces 100 are symmetrically connected to between two display modules. It should be noted that the display module of this embodiment includes at least two display modules, and the display device 200 can be more than two display modules. The number of the multi-directional multi-joint turning piece 100 in this embodiment includes at least two multi-directional multi-joint turning pieces.

Figure 4A:
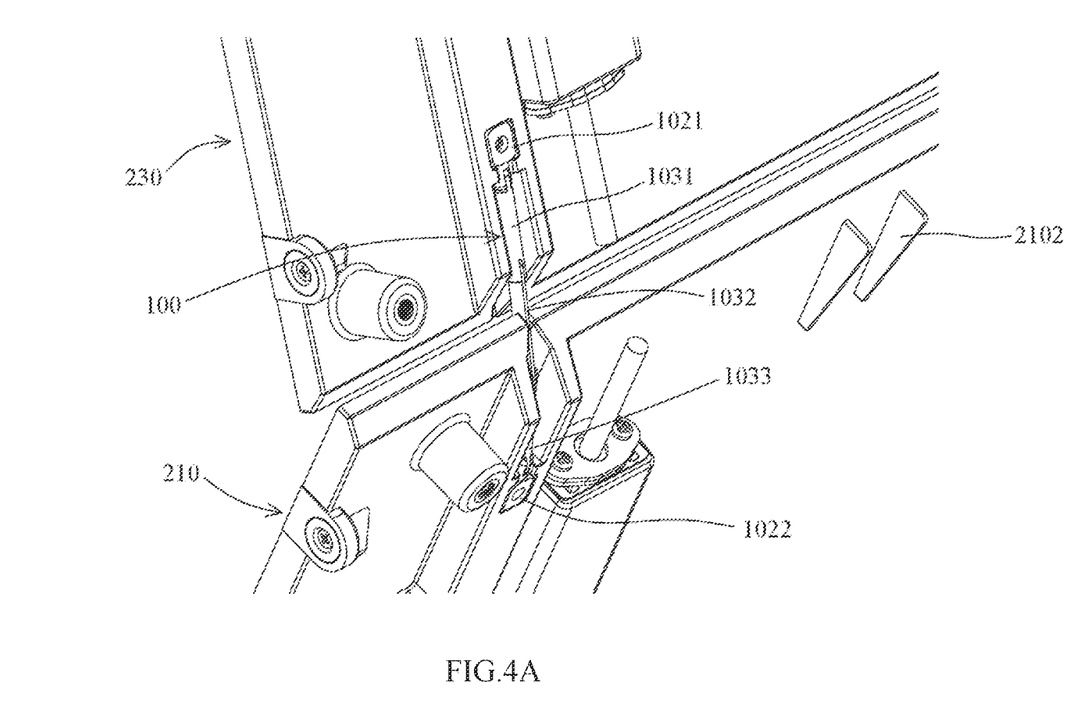
FIG. 4A is a partially enlarged view of the area "a" in FIG. 2 of the present invention.
Figure 4B:
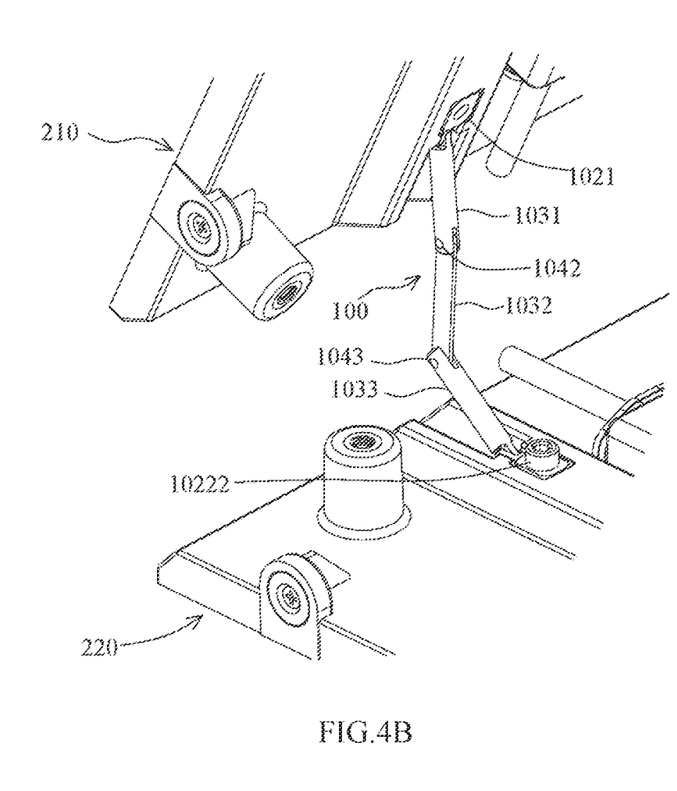
FIG. 4B is a partially enlarged view of area "b" in FIG. 2 of the present invention.
Figure 4C:
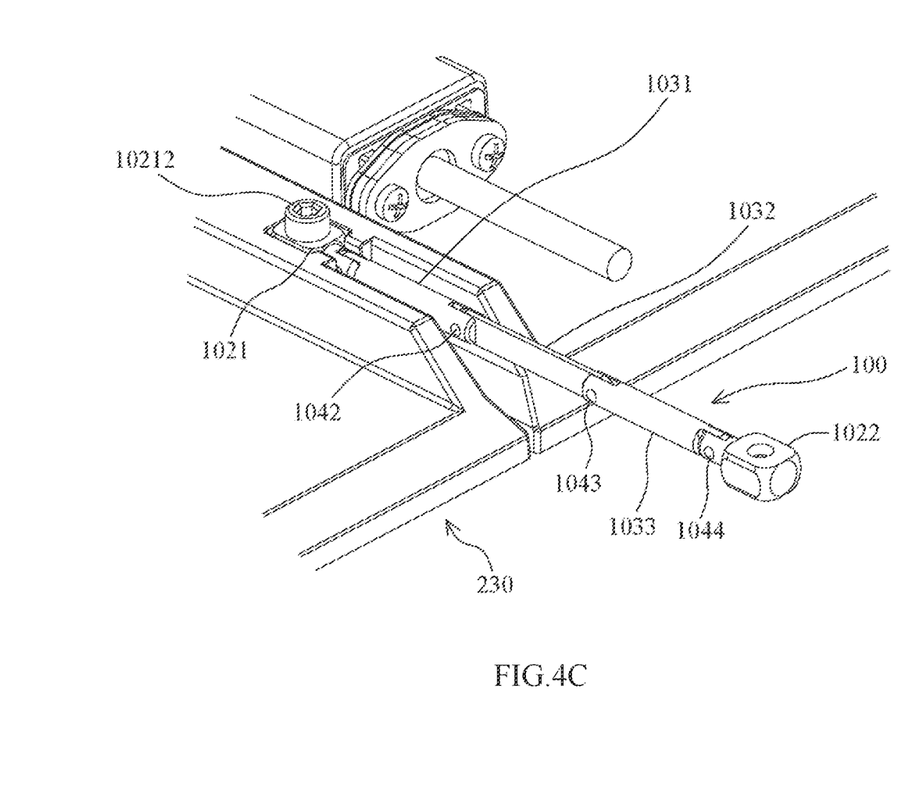
FIG. 4C is a partially enlarged view of area "c" in FIG. 2 of the present invention.

Please refer to FIG. 2, FIG. 4A, FIG. 4B, and FIG. 4C. FIG. 4A is a partially enlarged view of the area "a" in FIG. 2 of the present invention. FIG. 4B is a partially enlarged view of area "b" in FIG. 2 of the present invention. FIG. 4C is a partially enlarged view of area "c" in FIG. 2 of the present invention. The first display module 210 has a side D11 and a side D12. The second display module 220 has one side D21. The third display module 230 has a side D31 and a side D32. The side D11 is set corresponding to the side D21. The side D12 is set corresponding to the side D31. The first display module 210 has four multi-directional multi-joint turning pieces 100. Two of the multi-directional multi-joint turning piece 100 are disposed at both ends of the side D11. Two multi-directional multi-joint turning piece 100 are arranged at both ends of the side D12. The two multi-directional multi-joint turning piece 100 are disposed between the first display module 210 and the second display module 220. The two multi-directional multi-joint turning piece 100 are disposed between the first display module 210 and the third display module 230. The third display module 210 has two multi-directional multi-joint turning piece 100, and the two multi-directional multi-joint turning piece 100 are disposed at both ends of the side D31. The multi-directional multi-joint turning piece 100 is disposed between the first display module 210 and the third display module 230.

The first display module 210 has two multi-directional multi-joint turning piece 100. The two multi-directional multi-joint turning piece 100 are disposed at two ends of the side D11. The multi-directional multi-joint turning piece 100 are disposed between the first display module 210 and the second display module 220. The second display module 220 has two multi-directional multi-joint turning piece 100. The two multi-directional multi-joint turning piece 100 are disposed at two ends of the side D21.

The first display module 210 is connected to the second display module 220 by two multi-directional multi-joint turning piece 100. The first coupling piece 1021 of the multi-directional multi-joint turning piece 100 is fixed to the first display module 210 by screws 10212. The second coupling piece 1022 is fixed to the second display module 220 by screws 10222. The first display module 210 and the second display module 220 pivot and symmetrically expand or collapse around the side D11 and the side D21. The second display module 220 includes a guiding device 2202. The guiding device 2202 is disposed on the back B21 of the second display module 220, and is disposed of adjacent to the side D21. The guiding device 2202 is used for guiding the first display module 210. The guiding device 2102 is disposed on the back surface B11 of the first display module 210, and is disposed of adjacent to the side D21. The guiding device 2202 is used for guiding the first display module 210. The guiding device 2102 is used for guiding the third display module 230.

The first coupling piece 1021 of the multi-directional multi-joint turning piece 100 is fixed to the third display module 230 by screws 10212. The second coupling piece 1022 is fixed to the first display module 210 by screws 10222. The third display module 230 and the first display module 210 pivot and symmetrically expand or collapse around the side D12 and the side D31. The third display module 230 includes a guiding device 2302. The guiding device 2302 is disposed on the back B31 of the third display module 230, and is disposed of adjacent to the side D32.

Please refer to FIG. 1A, FIG. 1B, FIG. 2, and FIG. 5, the multi-directional multi-joint turning piece 100 includes the first coupling piece 1021, the second coupling piece 1022, and the first turning piece 1031, the second turning piece 1032, and the third turning piece 1033. The first coupling piece 1021 is connected to the first display module 210, and the second coupling piece 1022 is connected to the second display module 220. The first coupling piece 1021 is pivoted to the first turning piece 1031. The first turning piece 1031 is pivoted to the second turning piece 1032. The second turning piece 1032 is pivoted to the third turning piece 1033. The third turning piece 1033 is pivoted to the second coupling piece 1022.

The first coupling piece 1021 and the first turning piece 1031 pivot forward or backward to each other, and the first turning piece 1031 and the second turning piece 1032 pivot forward or backward to each other, and the second turning piece 1032 and the third turning piece 1033 pivot forward or backward to each other, and the third turning piece 1033 and the second coupling piece 1022 pivot forward or backward to each other, when the first display module 210 and the second display module 220 are pivoted.

One end of the first coupling piece 1021 is provided with a first through-hole H1 for connecting one end of the first turning piece 1031. The other end of the first turning piece 1031 is provided with a second through-hole H2 for connecting one end of the second turning piece 1032. The other end of the second turning piece 1032 is provided with a third through-hole H3 for connecting one end of the third turning piece 1033. The other end of the third turning piece 1033 is provided with a fourth through-hole H4 for connecting one end of the second coupling piece 1022.

Please refer to FIG. 1A, FIG. 1B, and FIG. 5, the multi-directional multi-joint turning piece 100 includes a first connector 1041, a second connector 1042, a third connector 1043, and a fourth connector Piece 1044. The first coupling piece 1021 includes a first connecting portion C1. The first connecting portion C1 is a rectangular structure with a front and a rear symmetrical panels having a first spacing S1 between the front and the rear panels. The first connecting portion C1 is disposed at one end of the first coupling piece 1021. The first turning piece 1031 is a rectangular structure and includes a second connecting portion C2 and a third connecting portion C3. The second connecting portion C2 is a rectangular structure with a first thickness T1. The second connecting portion C2 is provided at one end of the first turning piece 1031. The third connecting portion C3 is a rectangular structure with a front and a rear symmetrical panels having a second spacing S2. The third connecting portion C3 is disposed at the other end of the first turning piece 1031. The first turning piece 1031 has a second thickness T2, and the first thickness T1 is smaller than the second thickness T2. The first thickness T1 is smaller than the first spacing S1, the first coupling piece 1021 is connected to the first turning piece 1031 by the insertion of the second connecting portion C2 into the first connecting portion C1, and the first plug-in piece 1041 is inserted into the first through-hole H1. The first coupling piece 1021 is pivoted to the first turning piece 1031 by using the first plug-in piece 1041 as a pivot.

The second turning piece 1032 is a lamellar rectangular structure with a third thickness T3. In this embodiment, the third thickness T3 is preferably 1 cm. It should be noted that the third thickness T3 can also be any thickness. The second turning piece 1032 includes a fourth connecting portion C4 and a fifth connecting portion C5. The first turning piece 1031 is connected with the second turning piece 1032 by inserting the fourth connecting portion C4 into the third connecting portion C3. The second plug-in piece 1042 is inserted into the second through-hole H2, and the first turning piece 1031 is pivoted to the second turning piece 1032, and the second turning piece 1032 is used as a pivot.

The third turning piece 1033 includes a sixth connecting portion C6 and a seventh connecting portion C7. The third turning piece 1033 is a rectangular structure with a fourth thickness T4. The sixth connecting portion C6 is a rectangular structure with the front and the rear symmetrical panels having a third spacing S3 between the front and the rear panels. The sixth connecting portion C6 is disposed at one end of the third turning piece 1033, and the seventh connecting portion C7 is disposed on the other end of the third turning piece 1033. The third thickness T3 is smaller than the second spacing S2 and the third spacing S3. The third turning piece 1033 is connected to the second turning piece 1032 by the insertion of the fifth connecting portion C5 into the sixth connecting portion C6. The third plug-in piece 1043 is inserted into the third through-hole H3, and the third turning piece 1033 is pivoted to the second turning piece 1032, and the third plug-in piece 1043 is used as a pivot.

The second coupling piece 1022 includes an eighth connecting portion C8. The eighth connecting portion C8 has symmetrical front and rear panels, and a rectangular structure with a fourth spacing S4 between the front and back panels, and the eighth connecting portion C8 is set at one end of the second coupling piece 1022. The third turning piece 1033 includes a seventh connecting portion C7. The seventh connecting portion C7 is a rectangular structure with a fifth thickness T5. The seventh connecting portion C7 is disposed at the other end of the third turning piece 1033. The third turning piece 1033 is a rectangular structure with a fourth thickness T4. The fifth thickness T5 is smaller than the fourth thickness T4, and the fifth thickness T5 is smaller than the fourth spacing S4. The second coupling part 1022 is connected with the third turning piece 1033 by inserting the seventh connecting portion C7 into the eighth connecting portion C8. The fourth plug-in piece 1044 is inserted into the fourth through-hole H4, and the second coupling piece 1022 is pivoted to the third turning piece 1033, and the fourth plug-in piece 1044 is used as a pivot.

The multi-directional multi-joint turning 100 of the present invention, wherein the first turning piece 1031 and the first coupling piece 1021 have a first included angle, and the first included angle ranges from 102.42 degrees to 180 degrees. The third turning piece 1033 and the second coupling piece 1022 have a second included angle, and the second included angle ranges from 102.42 degrees to 180 degrees. With the design of the multi-directional multi-joint turning piece 100 of the present invention, the effect of restraining the inclination of the first display device 210, the second display device 220, and the third display device 230 during the pivoting process can be provided, so as to avoid the storage and stacking of items.

Figure 3A:
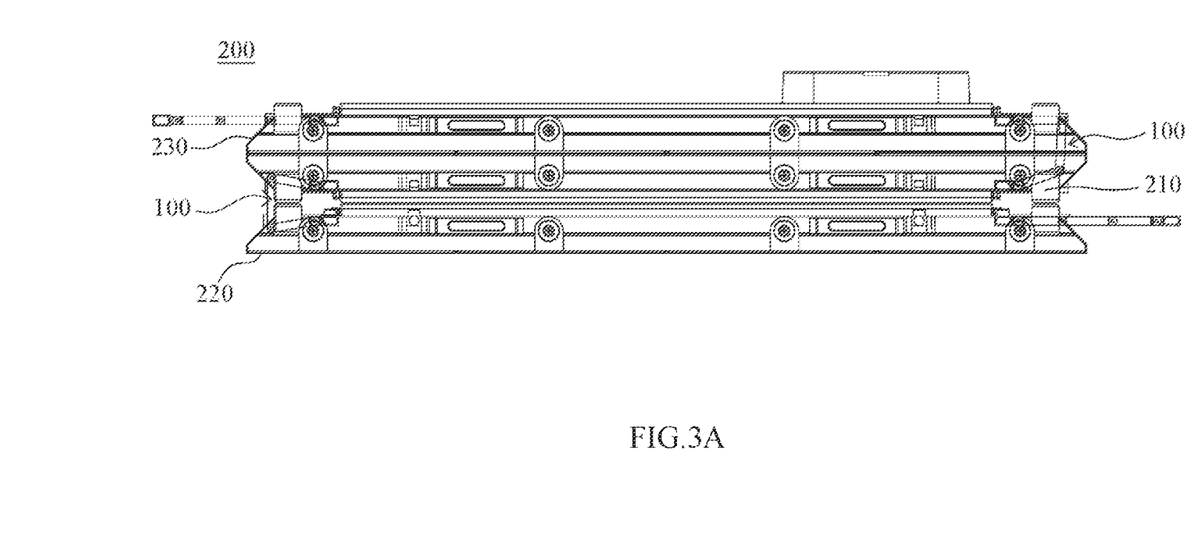
FIG. 3A is a schematic diagram of the display module in the status of storage according to the present invention.
Figure 3B:
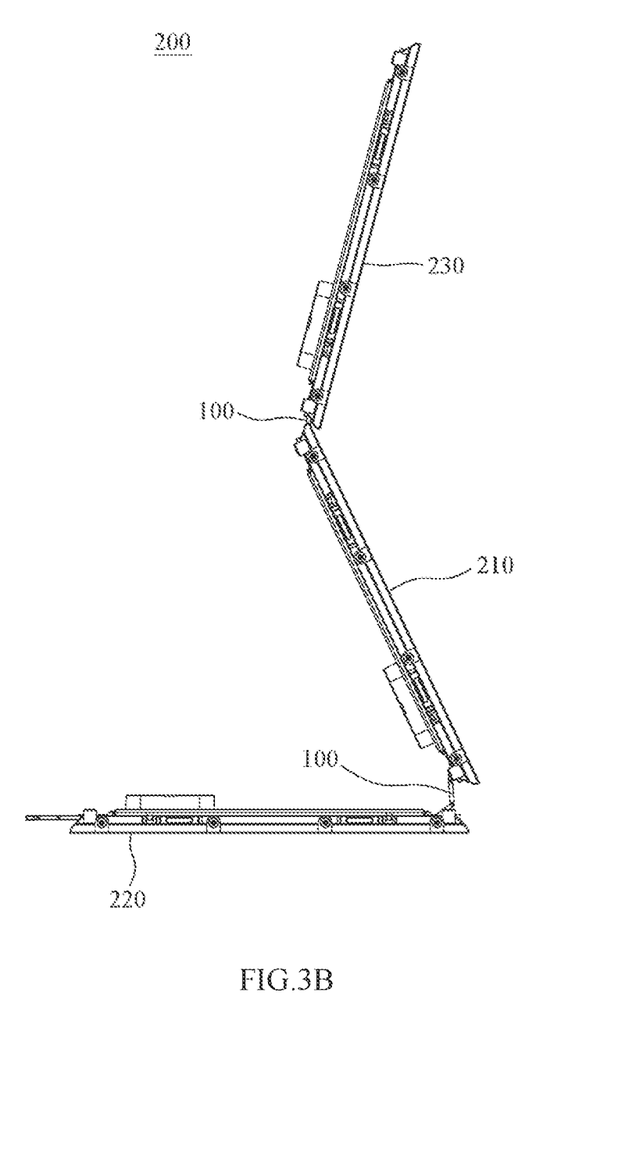
FIG. 3B is a schematic diagram of the display module of the present invention from being folded to unfolded.
Figure 3C:
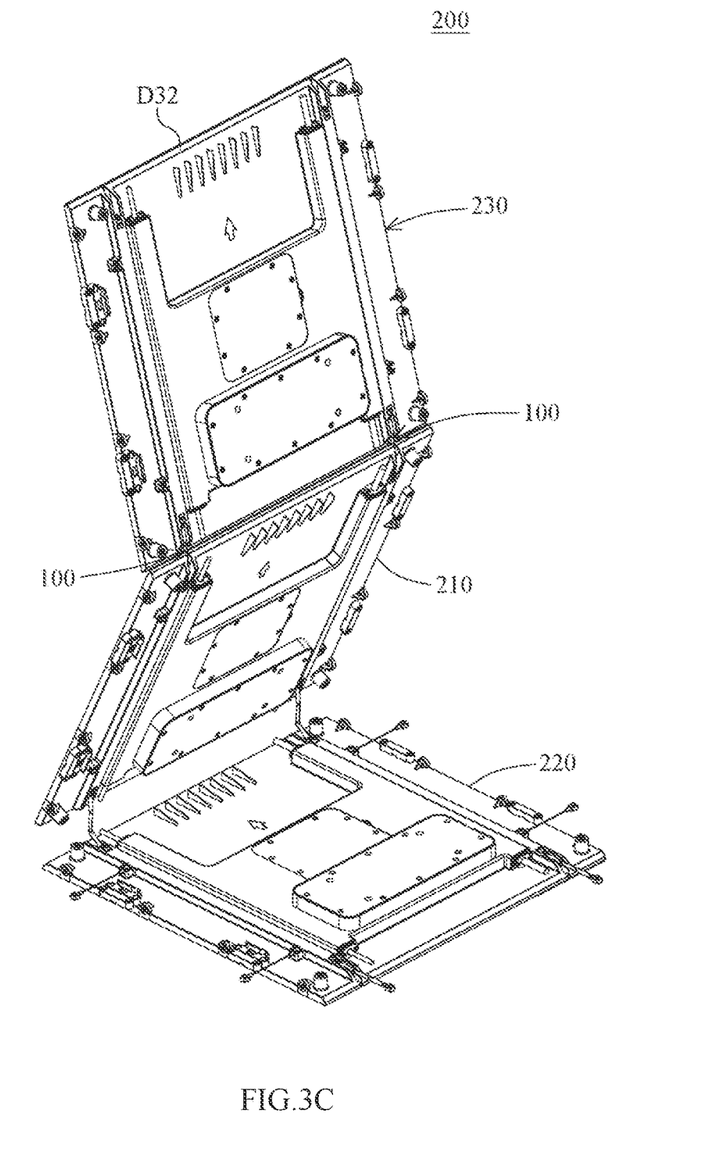
FIG. 3C is a schematic diagram of the display module of the present invention from being folded to unfolded.
Figure 3D:
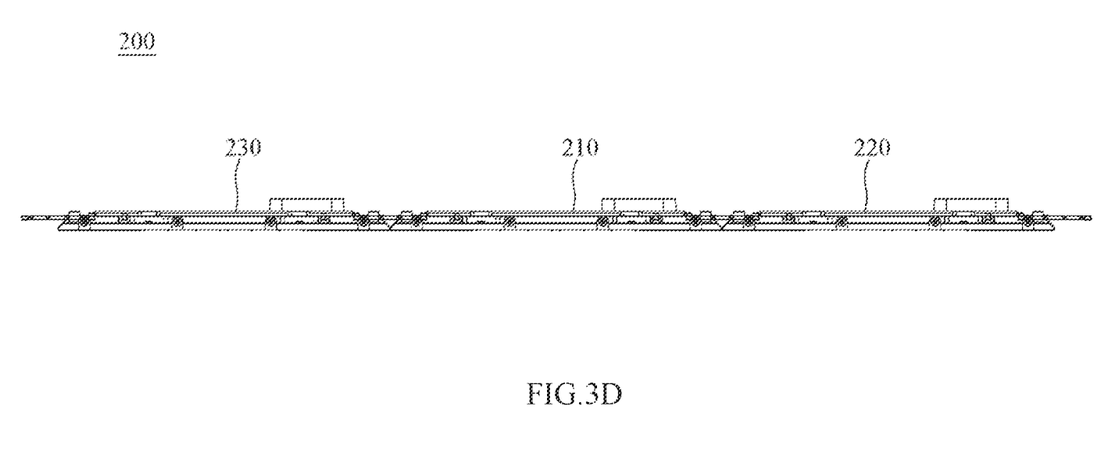
FIG. 3D is a retracted and expanded view of the display module of the present invention.

Please refer to FIG. 2, FIG. 3A, FIG. 3B, FIG. 3C, and FIG. 3D, wherein FIG. 3A is a schematic diagram of the display module in the status of storage according to the present invention. FIG. 3B is a schematic diagram of the display module of the present invention from being folded to unfolded. FIG. 3C is a schematic diagram of the display module of the present invention from being folded to unfolding. FIG. 3D is a retracted and expanded view of the display module of the present invention. The display device 200, from folded to fully developed, is in sequence FIG. 3A, FIG. 3B, FIG. 3C, and FIG. 3D.

The display device 200 is in the folded state, as shown in FIG. 3A. When the display device 200 of the present invention is in the folded state, the third display module 230 is located on the first display module 210, the first display module 210 is located on the second display module 220, and the display device 200 presents a zigzag shape which is stacked forward and backward. The third display module 230 has one side D32. When changing from the folded state to the unfolded state, pull up the side D32. Due to gravity, the third display module 230 drives the first display module 210 and the first display module 210 through the inertia of the multi-directional multi-joint turning piece 100. The first display module 210 drives the second display module 220 by the inertia of the multi-directional multi-joint turning piece 100. The third display module 230, the first display module 210, and the second display module 220 pivot backward and forward by themselves in a pendulum-like effect. During the unfolding process, the guiding device 2202 guides the first display module 210, and the guiding device 2102 guides the third display module 230 to smoothly slide to a predetermined position, or excessively pivot the wall for smooth and correct deployment. The unfolding process can be shown in FIG. 3B and FIG. 3C. Finally, the display device 200 is fully unfolded, as shown in FIG. 3D. During the unfolding period, the third display module 230 drives the first display module 210 through the multi-directional multi-joint turning piece 100, when the first display module 210 drives the second display module 220 by the multi-directional multi-joint turning piece 100, the first coupling piece 1021 and the first turning piece 1031 of the multi-joint turning piece 100 pivot relative to each other. The first turning piece 1031 and the second turning piece 1032 pivot relative to each other. The second turning piece 1032 and the third turning piece 1033 pivot relative to each other. The third turning piece 1033 and the second coupling piece 1022 pivot relative to each other. Eventually, the display device 200 will be fully expanded into a plane. With the multi-directional multi-joint turning piece 100, the third display module 230, the first display module 210, and the second display module 220 are maintained at a minimum distance or seamlessly connected. It should be noted that in this embodiment the display device is illustrated only by connecting one side of the three display modules, and this is only for illustration purposes. The present invention is not limited to vertical connection, and the display modules can also be connected in parallel horizontally.

The multi-directional and multi-joint turning piece 100 of the present invention is a kind of steel cable-like object with multi-directionality and turning elasticity, which improves the traditional use of the steel wire during the folding/unfolding process, due to the multi-directional folding process, the contact rhombic stress with the display module is generated, and the cable is broken and replaced, resulting in the defect of fracture.

In the above, the present invention based on the multi-directional multi-joint turning piece and display device have been described, but the present embodiment can be modified in various ways other than the above-mentioned embodiment as long as it does not deviate from its gist. The various embodiments and modifications described above can be implemented in an appropriate combination.

What is claimed is:

1. A multi-directional multi-joint turning piece, configured to connect a first display module and a second display module and to provide the first display module and the second display module to unfold or fold each other, comprising a first coupling piece, a first turning piece, a second turning piece, a third turning piece, and a second coupling piece, wherein the first coupling piece is connected to the first display module and the second coupling piece is connected to the second display module, the first coupling piece is pivoted to the first turning piece, the first turning piece is pivoted to the second turning piece, the second turning piece is pivoted to the third turning piece, and the third turning piece is pivoted to the second coupling piece, and wherein the first coupling piece and the first turning piece are pivoted forward or backward to each other, the first turning piece and the second turning piece are pivoted forward or backward to each other, the second turning piece and the third turning piece are pivoted forward or backward to each other, the third turning piece and the second coupling piece are pivoted forward or backward to each other, when the first display module and the second display module are unfolded or folded, wherein one end of the first coupling piece is provided with a first through-hole for connecting one end of the first turning piece, the other end of the first turning piece is provided with a second through-hole for connecting one end of the second turning piece, the other end of the second turning piece is provided with a third through-hole for connecting one end of the third turning piece, the other end of the third turning piece is provided with a fourth through-hole for connecting one end of the second coupling piece, and wherein the multi-directional multi joint turning piece further comprises a first plug-in piece, wherein the first coupling piece includes a first connecting portion, the first connecting portion is a rectangular structure with a front and a rear symmetrical panels having a first spacing between the front and the rear panels, the first connecting portion is disposed at one end of the first coupling piece, the first turning piece is a rectangular structure including a second connecting portion and a third connecting portion, the second connecting portion is a rectangular structure with a first thickness, the second connecting portion disposed at one end of the first turning piece, the third connecting portion is a rectangular structure with the front and the rear symmetrical panels having a second spacing between the front and the rear panels, the third connecting portion is disposed at the other end of the first turning piece, and the first turning piece has a second thickness, the first thickness is smaller than the second thickness, the first thickness is smaller than the first spacing, the first coupling piece is connected with the first turning piece by the insertion of the second connecting portion into the first connecting portion, the first plug-in piece is inserted into the first through-hole, the first coupling piece is pivoted to the first turning piece, and the first plug-in piece is used as a pivot.

2. The multi-directional multi joint turning piece of claim 1, further comprising a second plug-in piece, wherein the second turning piece is a lamellar rectangular structure with a third thickness, the second turning piece includes a fourth connecting portion and a fifth connecting portion, the first turning piece is connected to the second turning piece by the insertion of the fourth connecting portion into the third connecting portion, the second plug-in piece is inserted into the second through-hole, and the first turning piece is pivoted to the second turning piece, and the second plug-in piece is used as a pivot.

3. The multi-directional multi-joint turning piece of claim 2, further comprising a third plug-in piece, wherein the third turning piece includes a sixth connecting portion and a seventh connecting portion, the third turning piece is a rectangular structure with a fourth thickness, the sixth connecting portion is a rectangular structure with a front and a rear symmetrical panels having a third spacing between the front and the rear panels, the sixth connecting portion is disposed at one end of the third turning piece, and the seventh connecting portion is disposed at the other end of the third turning piece, the third thickness is smaller than the second spacing and the third spacing, the third turning piece is connected to the second turning piece by the insertion of the fifth connecting portion into the sixth connecting portion, the third plug-in piece is inserted into the third through-hole, the third plug-in piece is pivoted to the second turning piece, and the third plug-in piece is used as a pivot.

4. The multi-directional multi-joint turning piece of claim 3, further comprising fourth plug-in piece, wherein the second coupling piece includes an eighth connecting portion, the eighth connecting portion is a rectangular structure with a front and a rear symmetrical panels having a fourth spacing between the front and the rear panels, the eighth connecting portion is disposed at one end of the second coupling piece, the third turning piece includes a seventh connecting portion, the seventh connecting portion is a rectangular structure with a fifth thickness, the seventh connecting portion is disposed at the other end of the third turning piece, the third turning piece is a rectangular structure with a fourth thickness, the fifth thickness is smaller than the fourth thickness, and the fifth thickness is smaller than the fourth spacing, the second coupling piece is connected to the third turning piece by the insertion of the seventh connecting portion into the eighth connecting portion, the fourth plug-in piece is inserted into the fourth through-hole, and the second coupling piece is pivoted to the third turning piece and the fourth plug-in piece is used as a pivot.

5. The multi-directional multi-joint turning piece of claim 1, wherein the first turning piece and the first coupling piece have a first included angle, the first included angle ranges from 102.42 degrees to 180 degrees, the third turning piece and the second coupling piece have a second included angle, and the second included angle ranges from 102.42 degrees to 180 degrees.

6. The multi-directional multi-joint turning piece of claim 2, wherein the third thickness is 1 cm.

* * * * *